United States Patent
Kirchner

(10) Patent No.: US 11,089,243 B2
(45) Date of Patent: Aug. 10, 2021

(54) IMAGE SENSOR ELEMENT FOR OUTPUTTING AN IMAGE SIGNAL, AND METHOD FOR MANUFACTURING AN IMAGE SENSOR ELEMENT FOR OUTPUTTING AN IMAGE SIGNAL

(71) Applicant: Robert Bosch GmbH, Stuttgart (DE)

(72) Inventor: Tobias Kirchner, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 30 days.

(21) Appl. No.: 16/579,038

(22) Filed: Sep. 23, 2019

(65) Prior Publication Data

US 2020/0099871 A1 Mar. 26, 2020

(30) Foreign Application Priority Data

Sep. 24, 2018 (DE) .......................... 102018216199.2

(51) Int. Cl.
*H04N 5/351* (2011.01)
*H01L 27/146* (2006.01)
(Continued)

(52) U.S. Cl.
CPC ......... *H04N 5/351* (2013.01); *H01L 27/1461* (2013.01); *H01L 27/14645* (2013.01); *H04N 5/3745* (2013.01); *H04N 5/378* (2013.01)

(58) Field of Classification Search
CPC ...... H04N 5/351; H04N 5/3745; H04N 5/378; H01L 27/1461; H01L 27/14645;
(Continued)

(56) References Cited

U.S. PATENT DOCUMENTS 6,970,195 B1* 11/2005 Bidermann ............ H04N 5/369
   348/308
2010/0282946 A1* 11/2010 Yin .......................... H03F 3/08
   250/214 A (Continued)

OTHER PUBLICATIONS

Zarandy, Akos, "Focal-Plane Sensor-Processor Chips", ISBN 978-1-4419-6474-8, New Yoirk, Dordrecht, Heidelberg, London: Springer, 2011. Chapter 1, S. 11-15, Chapter 2, S. 17-43, Chapter 3, S. 45-71, Chapter 4, S. 73-104, Chapter 6, S. 125-149.

*Primary Examiner* — Timothy J Henn
(74) *Attorney, Agent, or Firm* — Norton Rose Fulbright US LLP; Gerard Messina

(57) ABSTRACT

An image sensor element for outputting an image signal. The image sensor element initially includes a first photoelement, the first photoelement being situated on a spatial area of a pixel on a semiconductor substrate. The image sensor element also includes a second photoelement that is doped and/or provided with a color filter in such a way that a spectral sensitivity of the first photoelement differs from a spectral sensitivity of the second photoelement. Lastly, the image sensor element includes an evaluation electronics system that is situated in the area of the pixel on the semiconductor substrate, the evaluation electronics system being situated in the area of the pixel in which the first photoelement is also implemented. The evaluation electronics system is designed to process a photoelement signal of the first photoelement and a photoelement signal of the second photoelement to form the image signal.

7 Claims, 2 Drawing Sheets

(51) Int. Cl.
*H04N 5/3745* (2011.01)
*H04N 5/378* (2011.01)

(58) Field of Classification Search
CPC ......... H01L 27/14603; H01L 27/14605; H01L 27/14621; H01L 27/14643; H01L 27/14685; H01L 27/14683
See application file for complete search history.

(56) References Cited

U.S. PATENT DOCUMENTS

2015/0350583 A1   12/2015   Mauritzson et al.
2016/0096477 A1   4/2016    Biemer
2020/0084403 A1*  3/2020    Suh ........................ H04N 5/379

* cited by examiner

IMAGE SENSOR ELEMENT FOR OUTPUTTING AN IMAGE SIGNAL, AND METHOD FOR MANUFACTURING AN IMAGE SENSOR ELEMENT FOR OUTPUTTING AN IMAGE SIGNAL

CROSS REFERENCE

The present application claims the benefit under 35 U.S.C. § 119 of German Patent Application No. DE 102018216199.2 filed on Sep. 24, 2018, which is expressly incorporated herein by reference in its entirety.

BACKGROUND INFORMATION

The present invention is directed to a device for outputting an image signal, a method and a computer program.

Standard cameras may be designed to output frames in fixed time intervals. In contrast, so-called "event-based cameras," used in robotics, for example, may output asynchronous events with microsecond resolution. An event may be generated when an individual pixel changes value.

SUMMARY

In accordance with example embodiments of the present invention, an image sensor element for outputting an image signal, a method for manufacturing an image sensor element for outputting an image signal, a device that uses this method, and lastly, a corresponding computer program, are provided. Advantageous refinements and enhancements of the present invention are described herein.

The image sensor element presented here is based on the approach that a photoelement, for example a photodiode, of a pixel is divided into a first and a second photoelement, the first and/or the second photoelement being doped and/or provided with a color filter in such a way that the first and the second photoelement have different spectral sensitivities. An evaluation electronics system of the pixel may be adapted in such a way that it may evaluate a sum of the electrical charges of both photoelements and process them to form an image signal.

An example image sensor element for outputting an image signal is provided, the image sensor element having the following features:

a first photoelement, the first photoelement being situated on a spatial area of a pixel on a semiconductor substrate;

a second photoelement that is doped and/or provided with a color filter in such a way that a spectral sensitivity of the first photoelement differs from a spectral sensitivity of the second photoelement; and an evaluation electronics system that is situated in the spatial area of the pixel on the semiconductor substrate, the evaluation electronics system being situated in the area of the pixel in which the first photoelement is also implemented, the evaluation electronics system being designed to process a photoelement signal of the first photoelement and a photoelement signal of the second photoelement to form the image signal.

An image sensor element may be, for example, a device for recording two-dimensional images from light in an electrical or mechanical manner. For example, semiconductor-based image sensors may be used that are able to record light into the middle infrared. An image signal may be understood to mean an electrical signal of an imager, for example an image sensor element. A photoelement may be a base element of an image sensor element such as a photodiode. A photoelement may be designed to collect light information for a pixel and convert it into an adequate electrical charge, and to supply this electrical charge to an evaluation electronics system after the end of the exposure. A pixel may be understood to mean an image point, an image cell, and/or an image element that indicate(s) the individual color values of digital raster graphics as well as the surface elements for an image sensor element that are needed for detecting and/or representing a color value. A semiconductor substrate may be, for example, a so-called wafer which in the semiconductor or photovoltaic industry and in micromechanics indicates, for example, a circular or square disk approximately 1 mm thick that represents the substrate, on which electronic components, in particular integrated circuits, micromechanical components, and/or photoelectrical coatings, are created by use of various technical methods. The semiconductor substrate may be made of monocrystalline silicon, for example, it also being possible to use other materials such as silicon carbide, gallium arsenide, and indium phosphide. A second photoelement may be understood to mean a photoelement that is separate from the first photoelement and that may emit its own (i.e., second) separate photoelement signal to the evaluation electronics system. The second photoelement may be arranged or formed in the area of the pixel or a further pixel, or in an area around the pixel. An evaluation electronics system may be a device for processing an electrical charge. The evaluation electronics system may be designed, for example, to associate a level of the electrical charge with a corresponding brightness, more precisely, a certain gray scale. Since the evaluation electronics system knows the geometric position of the pixel in the array, the gray scale may be associated with a certain position within the image.

The approach presented here for an image sensor element may be used in particular in a so-called "event-based camera" or a "spiking camera," which instead of standard intensity frames outputs changes in brightness at the pixel level. Thus, event-based cameras offer significant advantages over standard cameras, namely, a very high dynamic range, no motion blur, and a latency in the range of microseconds.

In event-based cameras, the change in the illumination of a pixel is measured directly at the pixel. Each pixel may include an evaluation electronics system that evaluates changes and relays this change if the value rises above or falls below a threshold. The evaluation electronics system may be accommodated, for example, directly on an image sensor element. The space required by the evaluation electronics system is thus not available for a photosensitive surface such as a photodiode. The ratio of the space requirement of the evaluation electronics system to that of a photodiode may be approximately 50:50. Thus, since the evaluation electronics system requires a relatively large amount of space, the resolution capability of spiking image sensor elements is generally far less than that of conventional image sensors. In addition, spiking image sensor elements are often not able, for example, to recognize colors. Colored pixels may thus be implemented by covering conventional pixels with a color filter. However, this filter also reduces the light sensitivity of the pixels, which may reduce the resolution. However, it is not possible to design the photoelements to be smaller, since they would then become less sensitive and would capture less light.

Thus, the advantages of the approach according to the present invention include, in particular, that a photoelement, for example a photodiode, of a pixel is divided into a first and a second photoelement. The first and/or the second photoelement may be doped and/or provided with a color filter in such a way that the first and the second photoelement have different spectral sensitivities. An evaluation electronics system may thus be advantageously adapted in such a way that it may evaluate a sum of the electrical charges of both photoelements in the form of a photoelement signal of the first photoelement and a photoelement signal of the second photoelement. The evaluation electronics system may also be enhanced in such a way that it is able to detect a difference between the first photoelement signal produced by the first photoelement and the second photoelement signal produced by the second photoelement. This allows a conclusion to be drawn as to whether the incident light on the image sensor element is in the range of the sensitivity of the first photoelement, or rather, the second photoelement. With a skillful selection of the spectral sensitivities of the first and second photoelements, it is also possible to obtain information concerning whether an object, for example a roadway marking, is yellow or white, which is very important for automated driving, for example. In summary, with the approach for an image sensor element presented here it is thus possible to increase the resolution capability of an event-based camera, resulting in an expanded field of application for these cameras.

According to one specific embodiment of the present invention, the second photoelement may be implemented in the predetermined area of the pixel on the semiconductor substrate on which the evaluation electronics system is also situated. Such a specific embodiment of the approach presented here thus offers the advantage that a larger surface area of a semiconductor substrate may be saved when a first and a second photoelement are connected to a shared evaluation electronics system in order to carry out a subsequent readout of the particular electrical charge from both photoelements. In comparison, since an evaluation electronics system is generally present for each pixel of the image sensor element, the surface area of an evaluation electronics system may be saved if two adjacent photoelements are connected to a shared evaluation electronics system.

According to another specific embodiment of the present invention, the evaluation electronics system may be designed to jointly read out the photoelement signal of the first photoelement and the photoelement signal of the second photoelement, and to process them to form the image signal. A joint readout may be understood to mean, for example, that the photoelement signal of the first photoelement represents a light parameter at a certain point in time, and the photoelement signal of the second photoelement represents a light parameter at this certain point in time. Thus, the two photoelement signals at the same point in time each image the light parameter that acts on each of the two photoelements. In this way, both photoelements (of a pixel, for example) may also be read out from the evaluation electronics system jointly or simultaneously with regard to the recording points in time of the photoelement signals. The processing of the two photoelement signals may take place in such a way that the photoelements are interpreted as being connected in a series connection or in a parallel connection, so that due to the cumulative surface area, for example the sensitivity (i.e., the SNR value) of both together is just as good as that of sensors whose pixels are not divided into two optical elements.

According to another specific embodiment of the present invention, the second photoelement may also be situated in an area adjacent to the pixel. Such a specific embodiment of the approach presented here thus offers the advantage that an adjustment of the image sensor element is achievable in the most simple and effective manner by using pixels, having different spectral sensitivities, that are situated directly adjacent to one another.

Furthermore, according to one specific embodiment of the present invention, the evaluation electronics system may be designed to detect a difference between the photoelement signal of the first photoelement and the photoelement signal of the second photoelement in order to output the image signal based on the detected difference. The evaluation electronics system may be designed in particular to evaluate a rate of change of the first and/or second photoelement signal, and output the image signal based on the rate of change. Such a specific embodiment of the approach presented here thus offers the advantage that the pixel whose spectral sensitivity better matches the spectrum of the incident light shows a more rapid change in the electrical charge or a more rapid change in the photoelement signal of the first photoelement and of the photoelement signal of the second photoelement.

In another specific embodiment of the present invention, the first and the second photoelements may be situated adjacent to one another in the area of the evaluation electronics system. The two photoelements may also be spatially nested so that they do not form two spatially separate elements. Such a specific embodiment of the approach presented here thus offers the advantage that the comparability of the first and second photoelements may be increased, which allows a conclusion to be drawn concerning a recognized color. However, this also imposes higher requirements on the precision of the color filter and/or the doping of the first and/or second photoelement.

In addition, according to one exemplary embodiment of the present invention, the image sensor element may include another photoelement that is situated on a spatial area of another pixel on a semiconductor substrate, as well as another evaluation electronics system that is situated in a predetermined area of the other pixel on the semiconductor substrate. The other evaluation electronics system may be situated in the area of the other pixel in which the other photoelement is also implemented, the other evaluation electronics system being designed to process a different photoelement signal of the other photoelement in order to output a different image signal. Instead of providing a pixel with two photoelements, adjacent pixels could also be differently doped and/or provided with a color filter in order to compare them to one another. To a limited extent, the spectral sensitivity of a photoelement may also be a function of the bias voltage of the photoelement. For a silicon-based photoelement, the maximum value of the spectral sensitivity changes by approximately 50 nm/30 V, for example. Such a design of an image sensor element would result in a checkerboard pattern. Such a specific embodiment of the approach presented here thus offers the advantage that a direct comparison of the photoelements would allow a conclusion to be drawn concerning a recognized color.

A camera unit for detecting the surroundings is provided according an example embodiments of the present invention, the camera unit including an image sensor element for outputting an image signal. A camera unit may be, for example, a photographic apparatus that electronically records static or moving images on a magnetic videotape or digital memory medium, or that may transmit via an interface. The camera unit is also designed to continuously detect and depict pieces of image information or images of the surroundings and the persons, objects, and/or infrastructure features situated there. Thus, the camera unit may be, for example, an event-based camera that, for example, is situated on a vehicle and/or may be used in robotics.

A method for manufacturing an image sensor element for outputting an image signal is provided according to example embodiments of the present invention, the method including the following steps:

Providing the evaluation electronics system in the predetermined area of the pixel on the semiconductor substrate;

Embedding the first photoelement in the area of the pixel on the semiconductor substrate in which the evaluation electronics system is also provided; and Providing the second photoelement, the second photoelement being designed in such a way that a spectral sensitivity of the first photoelement differs from a spectral sensitivity of the second photoelement.

The method provided here for manufacturing an image sensor element for outputting an image signal may be implemented, for example, in a control unit, for example in software or hardware or in a mixed form of software and hardware.

The approach presented here also provides a device that is designed for carrying out, controlling, or implementing the steps of a variant of a method presented here for manufacturing an image sensor element for outputting an image signal in appropriate equipment. The object underlying the approach may also be quickly and efficiently achieved by this embodiment variant of the present invention in the form of a device.

For this purpose, the device may include at least one processing unit for processing signals or data, at least one memory unit for storing signals or data, at least one interface to a sensor or an actuator for reading in sensor signals from the sensor or for outputting data and control signals to the actuator, and/or at least one communication interface for reading in or outputting data that are embedded in a communication protocol. The processing unit may be, for example, a signal processor, a microcontroller, or the like, and the memory unit may be a flash memory, an EEPROM, or a magnetic memory unit. The communication interface may be designed for reading in or outputting data wirelessly and/or in a line-bound manner; a communication interface which may read in or output the line-bound data may read in these data electrically or optically, for example, from an appropriate data transmission line, or output same to an appropriate data transmission line.

In the present context, a device may be understood to mean an electrical device that processes sensor signals and outputs control and/or data signals as a function thereof. The device may include an interface which may have a hardware and/or software design. In a hardware design, the interfaces may be part of a so-called system ASIC, for example, which contains various functions of the device. However, it is also possible for the interfaces to be dedicated, integrated circuits, or to be at least partially made up of discrete components. In a software design, the interfaces may be software modules which are present on a microcontroller, for example, in addition to other software modules.

Also advantageous is a computer program product or a computer program including program code which may be stored on a machine-readable medium or memory medium such as a semiconductor memory, a hard disk, or an optical memory, and used for carrying out, implementing, and/or controlling the steps of the method according to one of the specific embodiments described above, in particular when the program product or program is executed on a computer or a device.

BRIEF DESCRIPTION OF THE DRAWINGS

Exemplary embodiments of the present invention are illustrated in the figures and are explained in greater detail below.

DETAILED DESCRIPTION OF EXAMPLE EMBODIMENTS

Figure 1:
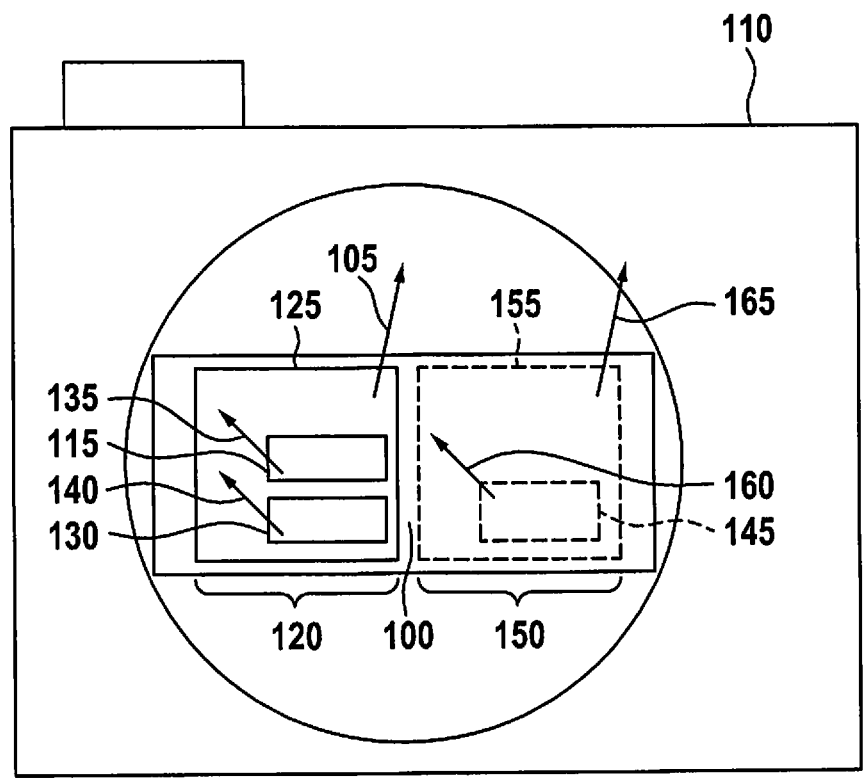
FIG. 1 shows a schematic view of an image sensor element for outputting an image signal according to one exemplary embodiment.

In the following description of advantageous exemplary embodiments of the present invention, identical or similar reference numerals are used for the elements having a similar action which are illustrated in the various figures, and a repeated description of these elements is dispensed with.

FIG. 1 shows a schematic view of an image sensor element 100 for outputting an image signal 105 according to one exemplary embodiment. Image sensor element 100 is situated in a camera unit 110 by way of example, image sensor element 100 being used for recording images from light in an electrical or mechanical manner. Camera unit 110 is a so-called event-based camera by way of example, which includes bio-inspired vision sensors that are naturally able to detect the dynamics of a scene and filter out redundant information.

According to one exemplary embodiment, image sensor element 100 includes a first photoelement 115 by way of example, first photoelement 115 being situated on a spatial area of a pixel 120 on a semiconductor substrate. Image sensor element 100 also includes an evaluation electronics system 125 that is situated in the spatial area of pixel 120 on the semiconductor substrate, evaluation electronics system 125 being situated in the area of pixel 120 in which first photoelement 115 is also implemented.

According to another exemplary embodiment, image sensor element 100 includes a second photoelement 130; first photoelement 115 and second photoelement 130 are situated adjacent to one another in the area of evaluation electronics system 125. Second photoelement 130 by way of example is doped and/or provided with a color filter in such a way that a spectral sensitivity of first photoelement 115 differs from a spectral sensitivity of second photoelement 130.

According to one exemplary embodiment, evaluation electronics system 125 is designed to process a photoelement signal 135 of first photoelement 115 and a photoelement signal 140 of second photoelement 130 to form image signal 105. Evaluation electronics system 125 is also designed to detect a difference between photoelement signal 135 of first photoelement 115 and photoelement signal 140 of second photoelement 130 in order to output image signal 105 based on this detected difference. Evaluation electronics system 125 is thus also designed to evaluate a rate of change of first photoelement signal 135 and/or second photoelement signal 140, and to output image signal 105 based on this rate of change.

In the exemplary embodiment of image sensor element 100 illustrated here, image sensor element 100 by way of example includes another photoelement 145 that is situated on a spatial area of another pixel 150 on a semiconductor substrate. Thus, the image sensor element also includes another evaluation electronics system 155 that is situated in a predetermined area of other pixel 150 on the semiconductor substrate. Other evaluation electronics system 155 is situated in the area of other pixel 150 in which other photoelement 145 is also implemented. Other evaluation electronics system 155 is thus designed, for example, to process a different photoelement signal 160 of other photoelement 145 in order to output a different image signal 165.

Figure 2:
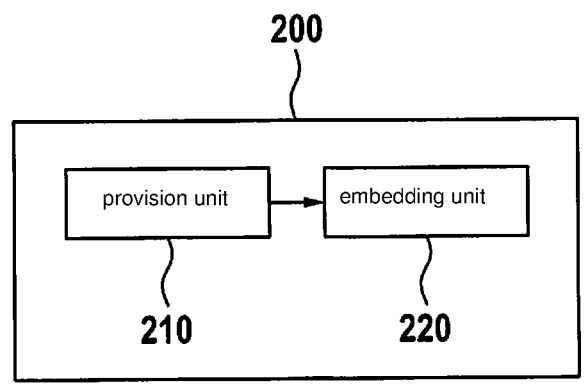
FIG. 2 shows a block diagram of a device for manufacturing an image sensor element for outputting an image signal according to one exemplary embodiment.

FIG. 2 shows a block diagram of a device 200 for manufacturing an image sensor element for outputting an image signal according to one exemplary embodiment. Device 200 includes by way of example a provision unit 210 and an embedding unit 220.

According to one exemplary embodiment, provision unit 210 is designed for providing the evaluation electronics system in the predetermined area of the pixel on the semiconductor substrate. According to one exemplary embodiment, embedding unit 220 is designed for subsequently embedding the first photoelement in the area of the pixel on the semiconductor substrate in which the evaluation electronics system is also provided. In addition, provision unit 210 is designed for subsequently providing the second photoelement, the second photoelement being designed in such a way that a spectral sensitivity of the first photoelement differs from a spectral sensitivity of the second photoelement.

Figure 3:
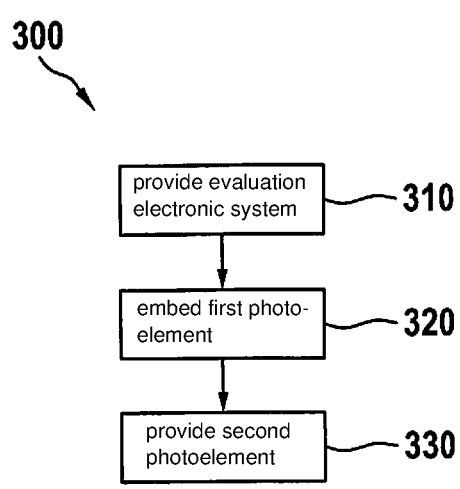
FIG. 3 shows a flow chart of one exemplary embodiment of a method for manufacturing an image sensor element for outputting an image signal according to one exemplary embodiment.

FIG. 3 shows a flow chart of one exemplary embodiment of a method 300 for manufacturing an image sensor element for outputting an image signal according to one exemplary embodiment. According to one exemplary embodiment, method 300 may be carried out on the device for manufacturing an image sensor element for outputting an image signal from FIG. 2.

The evaluation electronics system is provided in the predetermined area of the pixel on the semiconductor substrate in a step 310 of method 300. The first photoelement is embedded in the area of the pixel on the semiconductor substrate in which the evaluation electronics system is also provided, in a subsequent step 320. Lastly, the provision of the second photoelement takes place in a step 330 of method 300, the second photoelement being designed in such a way that a spectral sensitivity of the first photoelement differs from a spectral sensitivity of the second photoelement.

If an exemplary embodiment includes an "and/or" linkage between a first feature and a second feature, this is to be understood in such a way that according to one specific embodiment, the exemplary embodiment has the first feature as well as the second feature, and according to another specific embodiment, the exemplary embodiment either has only the first feature or only the second feature.

What is claimed is:

1. An image sensor element for outputting an image signal, the image sensor element comprising:
    a first photoelement situated on a spatial area of a pixel on a semiconductor substrate;
    a second photoelement that is: (i) doped so that a spectral sensitivity of the first photoelement differs from a spectral sensitivity of the second photoelement, and/or (ii) provided with a color filter so that the spectral sensitivity of the first photoelement differs from the spectral sensitivity of the second photoelement; and
    an evaluation electronics system situated in the area of the pixel on the semiconductor substrate, wherein the evaluation electronics system is situated in the area of the pixel in which the first photoelement is also implemented, and wherein the evaluation electronics system is configured to process a photoelement signal of the first photoelement and a photoelement signal of the second photoelement to form the image signal;
    wherein the evaluation electronics system is configured to detect a difference between the photoelement signal of the first photoelement and the photoelement signal of the second photoelement to output the image signal based on the detected difference, and wherein the evaluation electronics system is configured to evaluate a rate of change of the first photoelement signal and/or second photoelement signal, and to output the image signal based on the rate of change.

2. The image sensor element as recited in claim 1, wherein the second photoelement is implemented in the area of the pixel on the semiconductor substrate on which the evaluation electronics system is also situated.

3. The image sensor element as recited in claim 1, wherein the evaluation electronics system is configured to jointly read out the photoelement signal of the first photoelement and the photoelement signal of the second photoelement, and to process the photoelement signal of the first photoelement and the photoelement signal of the second photoelement to form the image signal.

4. The image sensor element as recited in claim 1, wherein the second photoelement is situated in an area adjacent to the pixel.

5. The image sensor element as recited in claim 1, wherein the first photoelement and the second photoelement are situated adjacent to one another in the area of the evaluation electronics system.

6. The image sensor element as recited in claim 1, wherein the image sensor element includes another photoelement that is situated on a spatial area of another pixel on a semiconductor substrate, and another evaluation electronics system that is situated in a predetermined area of the other pixel on the semiconductor substrate, wherein the other evaluation electronics system is situated in the area of the other pixel in which the other photoelement is also implemented, and wherein the other evaluation electronics system is configured to process a different photoelement signal of the other photoelement to output a different image signal.

7. A camera unit for detecting the surroundings, the camera unit including an image sensor element for outputting an image signal, comprising:
    a first photoelement situated on a spatial area of a pixel on a semiconductor substrate;
    a second photoelement that is: (i) doped so that a spectral sensitivity of the first photoelement differs from a spectral sensitivity of the second photoelement, and/or (ii) provided with a color filter so that the spectral sensitivity of the first photoelement differs from the spectral sensitivity of the second photoelement; and
    an evaluation electronics system situated in the area of the pixel on the semiconductor substrate, wherein the evaluation electronics system is situated in the area of the pixel in which the first photoelement is also implemented, and wherein the evaluation electronics system is configured to process a photoelement signal of the first photoelement and a photoelement signal of the second photoelement to form the image signal;
    wherein the evaluation electronics system is configured to detect a difference between the photoelement signal of the first photoelement and the photoelement signal of the second photoelement to output the image signal based on the detected difference, and wherein the evaluation electronics system is configured to evaluate a rate of change of the first photoelement signal and/or second photoelement signal, and to output the image signal based on the rate of change.

* * * * *